United States Patent
Ho et al.

(10) Patent No.: US 9,558,818 B2
(45) Date of Patent: Jan. 31, 2017

(54) MEMORY AND MEMORY MANAGING METHOD

(71) Applicant: Macronix International Co., Ltd., Hsinchu (TW)

(72) Inventors: Hsin Yi Ho, Hsinchu (TW); Ming-Hsiu Lee, Hsinchu (TW); Chun Hsiung Hung, Hsinchu (TW); Hsiang-Lan Lung, Ardsley, NY (US); Tien-Yen Wang, Zhubei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/020,684

(22) Filed: Sep. 6, 2013

(65) Prior Publication Data
US 2014/0254257 A1    Sep. 11, 2014

Related U.S. Application Data

(60) Provisional application No. 61/775,738, filed on Mar. 11, 2013.

(51) Int. Cl.
*G11C 13/00*    (2006.01)

(52) U.S. Cl.
CPC ....... *G11C 13/0004* (2013.01); *G11C 13/0033* (2013.01); *G11C 2013/0054* (2013.01)

(58) Field of Classification Search
CPC .......................... G11C 13/0004; G11C 11/5678
USPC ........................................................ 365/163
See application file for complete search history.

(56) References Cited

U.S. PATENT DOCUMENTS

| 7,548,451 | B2 * | 6/2009 | Oh et al. ................. 365/163 |
| 7,558,100 | B2 | 7/2009 | Ahn et al. |
| 7,787,282 | B2 * | 8/2010 | Ramani et al. ............ 365/148 |
| 8,139,395 | B2 * | 3/2012 | Kotaki ................ G11C 7/02 365/148 |
| 8,634,235 | B2 | 1/2014 | Lung et al. |
| 9,336,867 | B2 | 5/2016 | Lung et al. |
| 2008/0068879 | A1 | 3/2008 | Ahn et al. |
| 2009/0237977 | A1 | 9/2009 | Ramani et al. |
| 2011/0013446 | A1 * | 1/2011 | Lung ........................ 365/163 |

(Continued)

FOREIGN PATENT DOCUMENTS

| CN | 101150138 A | 3/2008 |
| CN | 102298964 B | 4/2014 |
| WO | WO 2012/176452 A | 12/2012 |

OTHER PUBLICATIONS

Lung et al., "A Method to Maintain Phase-Change Memory Precoding Data Retention after High Temperature Solder Bonding Process in Embedded Systems," *Symposium on VLSI Technology Digest of Technical Papers*, pp. 98-99 (2011).

(Continued)

*Primary Examiner* — Hoai V Ho
*Assistant Examiner* — Tri Hoang
(74) *Attorney, Agent, or Firm* — Finnegan, Henderson, Farabow, Garrett & Dunner LLP

(57) ABSTRACT

A method for managing memory includes setting a state of a first memory cell to a first state representing a first data and setting a state of a second memory cell to a second state representing the first data. If the state of the second memory cell has changed to a third state representing a second data different from the first data, the method also includes changing the state of the second memory cell back to the second state.

19 Claims, 7 Drawing Sheets

(56) References Cited

U.S. PATENT DOCUMENTS

| | | |
|---|---|---|
| 2011/0317480 A1 | 12/2011 | Lung et al. |
| 2012/0087183 A1* | 4/2012 | Chang .......................... 365/163 |
| 2014/0104933 A1* | 4/2014 | Yamahira ..................... 365/148 |
| 2014/0119110 A1 | 5/2014 | Lung et al. |

OTHER PUBLICATIONS

Bedeschi et.al., "An 8Mb Demonstrator for High-Density 1.8V Phase-Change Memories," *Symposium on VLSI Circuits Digest of Technical Papers*, pp. 442-445 (2004).

* cited by examiner

MEMORY AND MEMORY MANAGING METHOD

CROSS-REFERENCE TO RELATED APPLICATIONS

This application is based upon and claims the benefit of Provisional Application No. 61/775,738, filed on Mar. 11, 2013, the entire content of which is incorporated herein by reference.

TECHNOLOGY FIELD

The disclosure relates to memories and managing memories and, more particularly, to methods for restoring lost pre-stored data.

BACKGROUND

Sometimes, non-volatile memories are shipped to customers with pre-stored data. A customer may put the memory into another external process, such as a high-temperature process. The high-temperature process may be, for example, a solder bonding process. During such a process, part or all of the pre-stored data in the memory may be lost. For example, a phase-change memory (PCM) stores digital data using different states of a phase-change material, which has different resistances at different states. That is, a phase-change material may have a first resistance when it is in an initial state. When heated to a crystallizing temperature, the phase-change material switches to a polycrystalline state and has a second resistance. Further, when heated to a melting temperature, the phase-change material switches to an amorphous state and has a third resistance. Usually, the polycrystalline state and the amorphous state of a phase-change material are used to represent binary "1" and binary "0", respectively. Therefore, if a PCM having pre-stored data is subject to a high-temperature process, such as the solder bonding process, the high temperature may cause some or all memory cells of the PCM to change state, resulting in loss of the pre-stored data.

SUMMARY

In accordance with the disclosure, there is provided a method for managing memory. The method includes setting a state of a first memory cell to a first state representing a first data and setting a state of a second memory cell to a second state representing the first data. If the state of the second memory cell has changed to a third state representing a second data different from the first data, the method also includes changing the state of the second memory cell back to the second state.

Also in accordance with the disclosure, there is provided a memory including a first memory cell and a second memory cell. A state of the first memory cell is in a first state representing a first data. A state of the second memory cell is in a second state representing the first data. The first and second memory cells have different state change rates with respect to an external process.

Features and advantages consistent with the disclosure will be set forth in part in the description which follows, and in part will be obvious from the description, or may be learned by practice of the disclosure. Such features and advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE EMBODIMENTS

Embodiments consistent with the disclosure include methods for managing memories and memories that are capable of restoring lost data.

Hereinafter, embodiments consistent with the disclosure will be described with reference to the drawings. Wherever possible, the same reference numbers will be used throughout the drawings to refer to the same or like parts.

In some embodiments described below, a phase-change memory (PCM) is used as an example (a memory cell in a PCM is also referred to as a phase-change memory cell in this disclosure). However, the methods and apparatuses described in this disclosure apply to any other types of memories that suffer the problem of loss of pre-stored data.

Figure 1A:
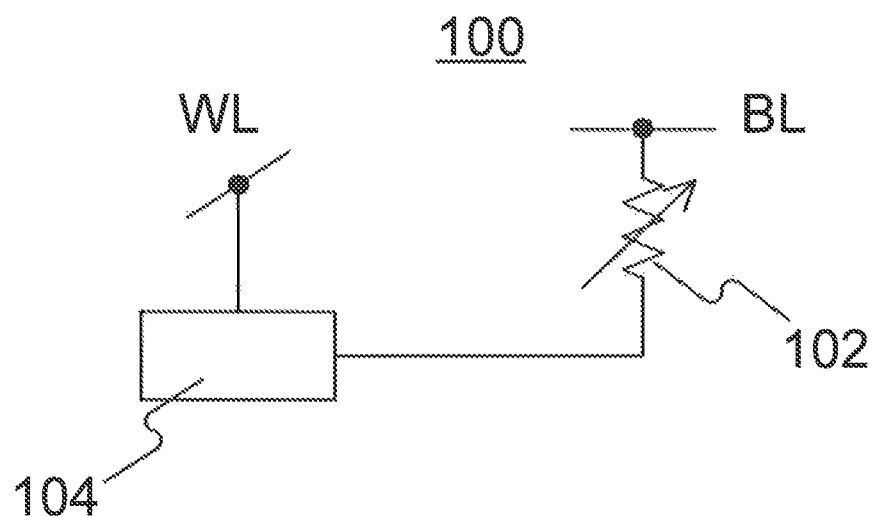
FIGS. 1(A)-1(D) schematically show memory cells according to exemplary embodiments.

FIG. 1(A) schematically shows an exemplary memory cell 100 in a PCM. As shown in FIG. 1(A), the memory cell 100 includes a variable resistor 102 electrically coupled with an access device 104. As shown in FIG. 1(A), the access device 104 is electrically coupled to a word line (WL) and the variable resistor 102 is electrically coupled to a bit line (BL). In other embodiments, depending on the type of device used as the access device, the variable resistor 102 may instead be electrically coupled to the WL and the access device electrically coupled to the bit line. Further, if the access device 104 is a three-terminal device, one terminal may be electrically coupled to the bit line or a ground (GND), and correspondingly the variable resistor 102 may be electrically coupled to the ground or the bit line.

Figure 1B:
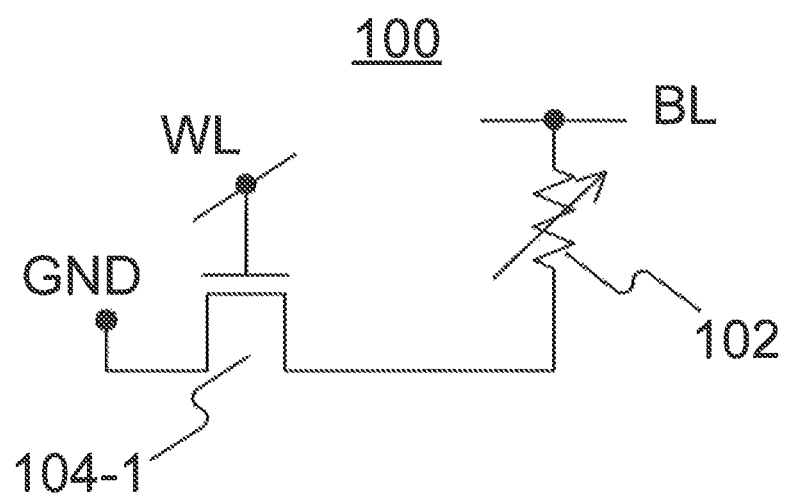
Figure 1C:
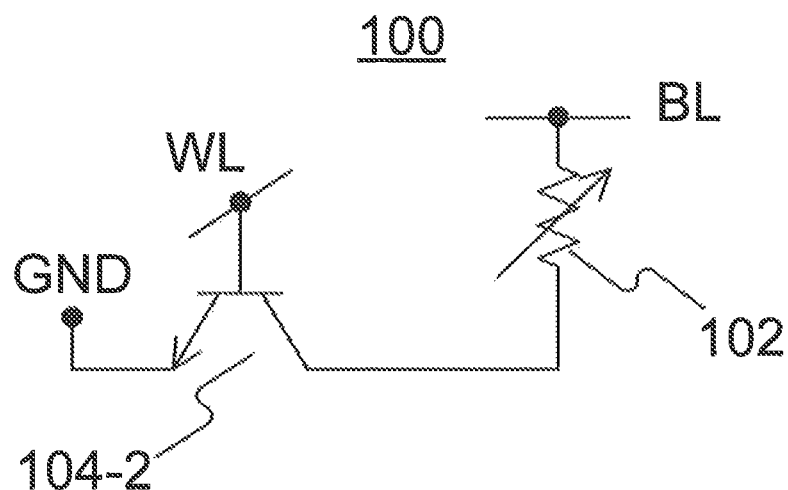
Figure 1D:
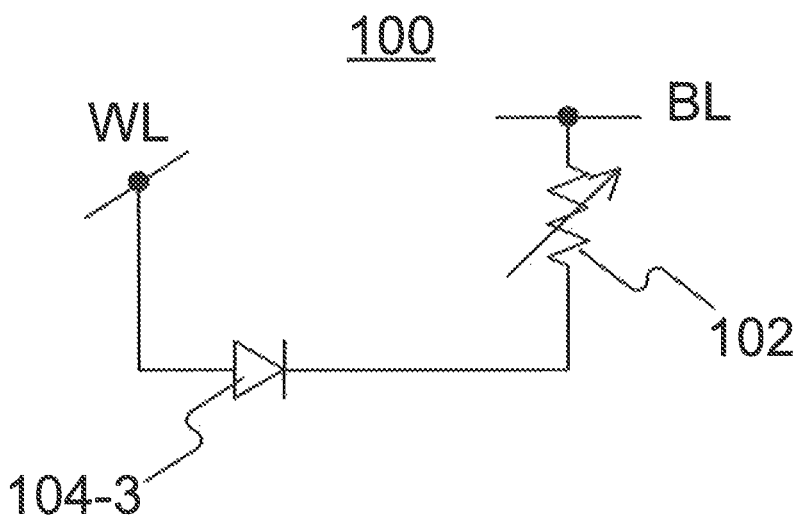

Different electronic devices may be used as the access device 104, such as a field-effect transistor (FET) 104-1 shown in FIG. 1(B), a bipolar-junction transistor (BJT) 104-2 shown in FIG. 1(C), or a diode 104-3 shown in FIG. 1(D). The FET 104-1 may be, for example, an n-channel FET or a p-channel FET. The BJT 104-2 may be, for example, an pnp BJT or an npn BJT. The diode 104-3 may be, for example, a p-n junction diode or a Schottky diode.

When the access device 104 includes the FET 104-1 as shown in FIG. 1(B), a gate of the FET 104-1 is electrically coupled to the word line. One of a source or a drain of the FET 104-1 is electrically coupled to the variable resistor 102. As shown in FIG. 1(B), the other one of the source or drain is electrically coupled to ground, in which case, the variable resistor 102 is further electrically coupled to the bit line. Alternatively (not shown), the other one of the source or drain of the FET 104-1 may be electrically coupled to the bit line, in which case, the variable resistor 102 is further coupled to the ground.

When the access device 104 includes the BJT 104-2 as shown in FIG. 1(C) (an npn BJT is used as an example in FIG. 1(C)), a base of the BJT 104-2 is electrically coupled to the word line. As shown in FIG. 1(C), a collector of the BJT 104-2 is electrically coupled to the variable resistor 102 and an emitter of the BJT 104-2 is electrically coupled to the ground. The variable resistor 102 is further electrically coupled to the bit line. Alternatively (not shown), the variable resistor 102 may be electrically coupled between the emitter of the BJT 104-2 and the bit line, in which case, the collector of the BJT 104-2 is electrically coupled to the ground. Further (not shown), the variable resistor 102 may be electrically coupled between one of the emitter or collector of the BJT 104-2 and the ground, in which case, the other one of the emitter or collector is coupled to the bit line.

When the access device 104 includes the diode 104-3 as shown in FIG. 1(D), one of an anode or a cathode of the diode 104-3 is electrically coupled to the variable resistor 102, which, in turn, is electrically coupled to the bit line. The other one of the anode or cathode of the diode 104-3 is electrically coupled to the word line.

The variable resistor 102 is made of a phase-change material, such as, for example, GeSbTe. A phase-change material may switch between different states, which can be exploited for data storage. For example, a phase-change material switching between two states (such as a polycrystalline state having a low resistance and an amorphous state having a high resistance) may be used to store bit "0" or "1". As another example, a phase-change material switching between four states having different resistances may be used to store "00", "01", "10", and "11".

The state of the variable resistor 102 (and thus the resistance thereof) can be changed by subjecting the variable resistor 102 to different temperatures for different amounts of time. And the change of temperature may be caused by applying a current to the variable resistor 102 (i.e., the phase-change material of the variable resistor 102). A larger current causes the variable resistor 102 to be heated to a higher temperature, so that controlling the current magnitude should control the temperature to which the variable resistor 102 is heated.

Figure 2A:
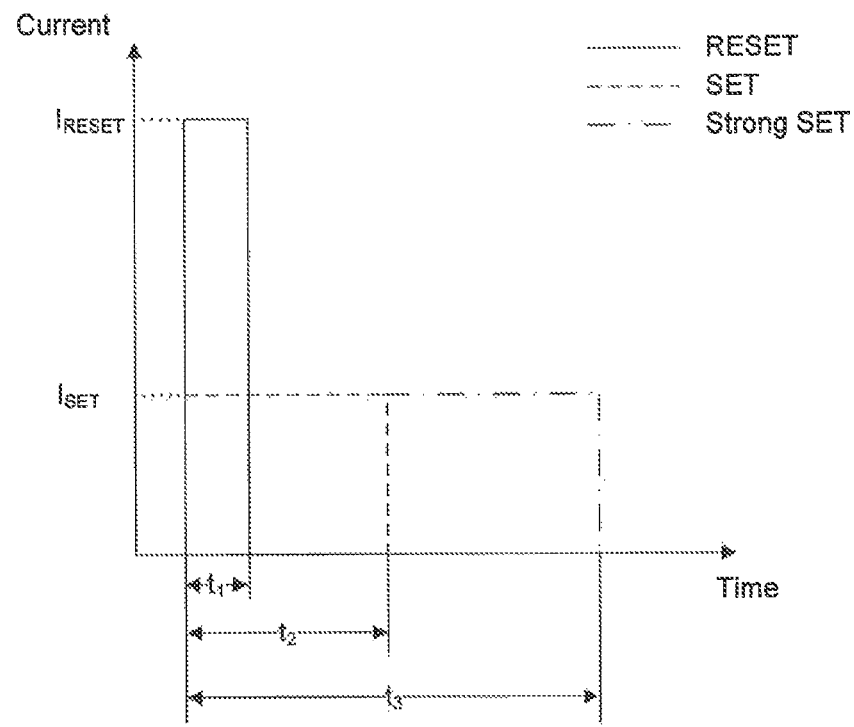
FIGS. 2(A) and 2(B) are graphs respectively showing changes of current applied to and temperature in a memory cell during different operations.

FIG. 2(A) graphically shows a change of current applied to the variable resistor 102 during a RESET operation and a SET operation. As shown in FIG. 2(A), during the RESET operation, a current $I_{RESET}$ is applied to the variable resistor 102 for a period of time $t_1$. During the SET operation, a current $I_{SET}$ that is lower than the current $I_{RESET}$, is applied to the variable resistor 102 for a period of time $t_2$ longer than the period of time $t_1$.

Figure 2B:
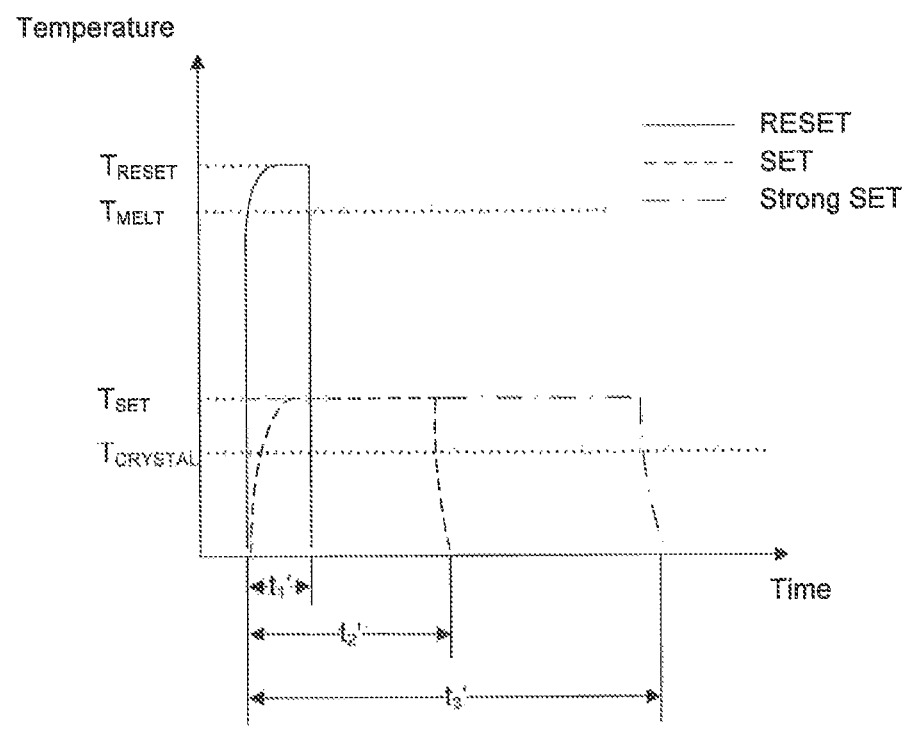

FIG. 2(B) schematically shows a change of temperature of the variable resistor 102 during the RESET operation and the SET operation, respectively, caused by the current $I_{RESET}$ and the current $I_{SET}$. As shown in FIG. 2(B), because of the current $I_{RESET}$ (FIG. 2(A)), the variable resistor 102 is heated to a temperature $T_{RESET}$ higher than a melting temperature $T_{MELT}$ of the phase-change material of the variable resistor 102, and is kept at that temperature for a period of time $t_1'$. As a result, the phase-change material switches to a high-resistance amorphous state. Similarly, because of the current $I_{SET}$, the variable resistor 102 is heated to a temperature $T_{SET}$ higher than a crystallization temperature $T_{CRYSTAL}$ of the phase-change material of the variable resistor 102, but lower than the melting temperature $T_{MELT}$, and is kept at that temperature for a period of time $t_2'$. As a result, the phase-change material switches to a low-resistance polycrystalline state.

Consistent with embodiments of the disclosure, the periods of time $t_1'$ and $t_2'$ may be approximately the same as the periods of time $t_1$ and $t_2$, respectively. However, since the temperature change may not respond to the current change immediately, the periods of time $t_1'$ and $t_2'$ may be slightly different from (and generally longer than) the corresponding periods of time $t_1$ and $t_2$.

Figure 3A:
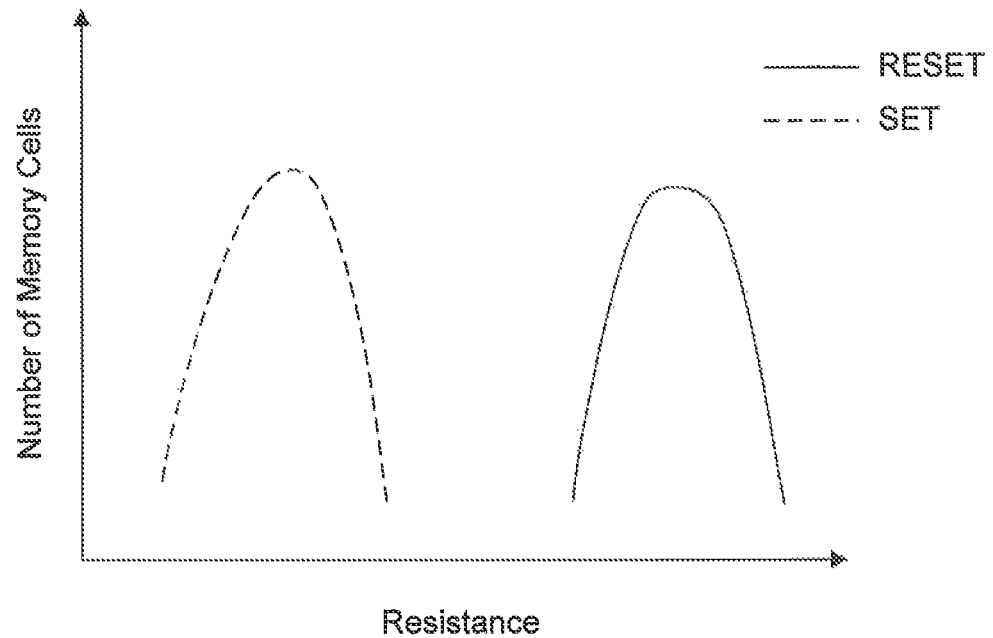
FIGS. 3(A)-3(C) are graphs showing resistance distributions for memory cells in different conditions before and after a high-temperature process.

As discussed above, performing a SET or a RESET operation on a memory cell brings the memory cell to a state having a certain resistance. Due to various uncertainties, such as manufacturing variations, memory cells on a same chip may not have the same resistance after a SET or a RESET operation. That is, the resistances of memory cells on a chip may exhibit a certain distribution. FIG. 3(A) schematically shows such resistance distributions for memory cells on a chip having a plurality of phase-change memory cells after a SET or a RESET operation is performed. In FIG. 3(A), the abscissa represents resistance, and the ordinate represents number of memory cells having a certain resistance after a SET or a RESET operation. The dashed curve represents a resistance distribution for memory cells after being subjected to a SET operation (hereinafter, a memory cell having been subjected to an intentional SET operation (i.e., not accidentally by an external heating process, such as a baking or solder bonding process), is referred to as a SET condition memory cell or a memory cell in the SET condition). The solid curve represents a resistance distribution for memory cells after being subjected to a RESET operation (hereinafter, a memory cell having been subjected to a RESET operation is referred to as a RESET condition memory cell or a memory cell in the RESET condition). In FIG. 3(A), the two curves are well separated from each other. The SET condition memory cells have a resistance within a resistance range representing one of the two bits "0" and "1", such as "1", and the RESET condition memory cells have a resistance within another resistance range representing the other one of the two bits "0" and "1", such as "0".

Figure 3B:
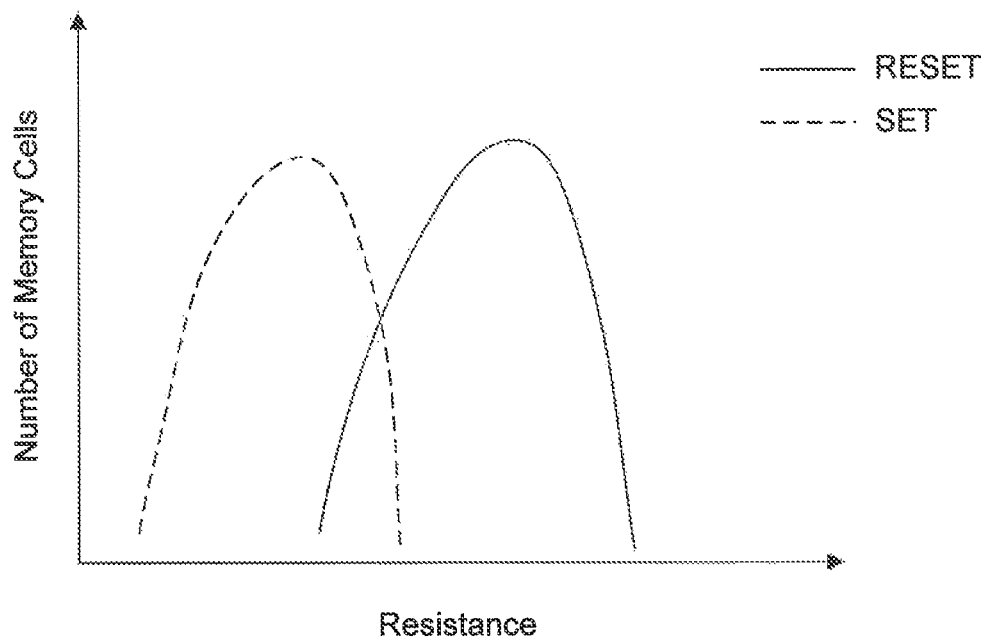

If the chip is subjected to a high-temperature process, such as a baking process at a relatively high temperature, such as about 250° C., for a certain amount of time, such as one hour, the resistance distributions may change. FIG. 3(B) schematically shows the resistance distributions for the memory cells after a high-temperature process. In FIG. 3(B), the dashed curve represents the resistance distribution for the SET condition memory cells after a high-temperature process, and the solid curve represents the resistance distribution for the RESET condition memory cells after a high-temperature process.

As schematically shown in FIGS. 3(A) and 3(B), the resistance distribution for the SET condition memory cells does not change much after the high-temperature process. However, the resistance distribution for the RESET condition memory cells shifts to a lower-resistance range after the high-temperature process, and overlaps with the resistance distribution for the SET condition memory cells after the high-temperature process. This is because the RESET condition memory cells have a higher state change rate than the SET condition memory cells with respect to the high-temperature process. That is, during the high-temperature process, the state of the RESET condition memory cells changes faster than the state of the SET condition memory cells. Therefore, after such a high-temperature process, when a memory cell is read and its resistance determined, if the determined resistance falls within the overlapping range shown in FIG. 3(B), it is not known whether that memory cell is a SET condition memory cell or a RESET condition memory cell. That is, it cannot be determined whether the bit data previously stored in that memory cell is "1" or "0".

A phase-change memory cell has an initial resistance before being subjected to any SET or RESET operation (hereinafter, a memory cell having not been subjected to any SET or RESET operation is referred to as an initial condition memory cell or a memory cell in the initial condition). Such an initial condition is a "one-time" condition. That is, after an initial condition memory cell is subjected to a SET or a RESET operation and thus switches to a SET condition or a RESET condition, it would not switch back to the initial condition again. Due to various uncertainties, such as manufacturing variations, resistances of initial condition memory cells on a chip may also be different from each other and exhibit a distribution, such as the distribution schematically illustrated by the solid curve in FIG. 3(C). The resistance distribution for the initial condition memory cells may not change much after a high-temperature process, such as the distribution schematically illustrated by the dashed curve in FIG. 3(C).

As described above, performing a SET operation on a phase-change memory cell, i.e., applying a SET current $I_{SET}$ to the memory cell for a period of time $t_1$ pushes the memory cell into a low-resistance state. If the SET current $I_{SET}$ is applied to a memory cell for a period of time $t_3$ longer than the period of time $t_1$ (as schematically shown in FIG. 2(A)), the memory cell would be heated to the temperature higher than the crystallization temperature $T_{CRYSTAL}$ and lower than the melting temperature $T_{MELT}$ for a period of time $t_3'$ longer than the period of time $t_1'$ (as schematically shown in FIG. 2(B)). As a consequence, the resistance of the memory cell may become even lower than the resistance of a memory cell subjected to a SET operation. The period of time $t_3$ may be, for example, about 10 times the period of time $t_1$. In this disclosure, the operation of applying $I_{SET}$ to a memory cell for the period of time $t_3$ is referred to as a Strong SET operation, and the memory cell subjected to the Strong SET operation is referred to as a Strong SET condition memory cell or a memory cell in the Strong SET condition.

Figure 3C:
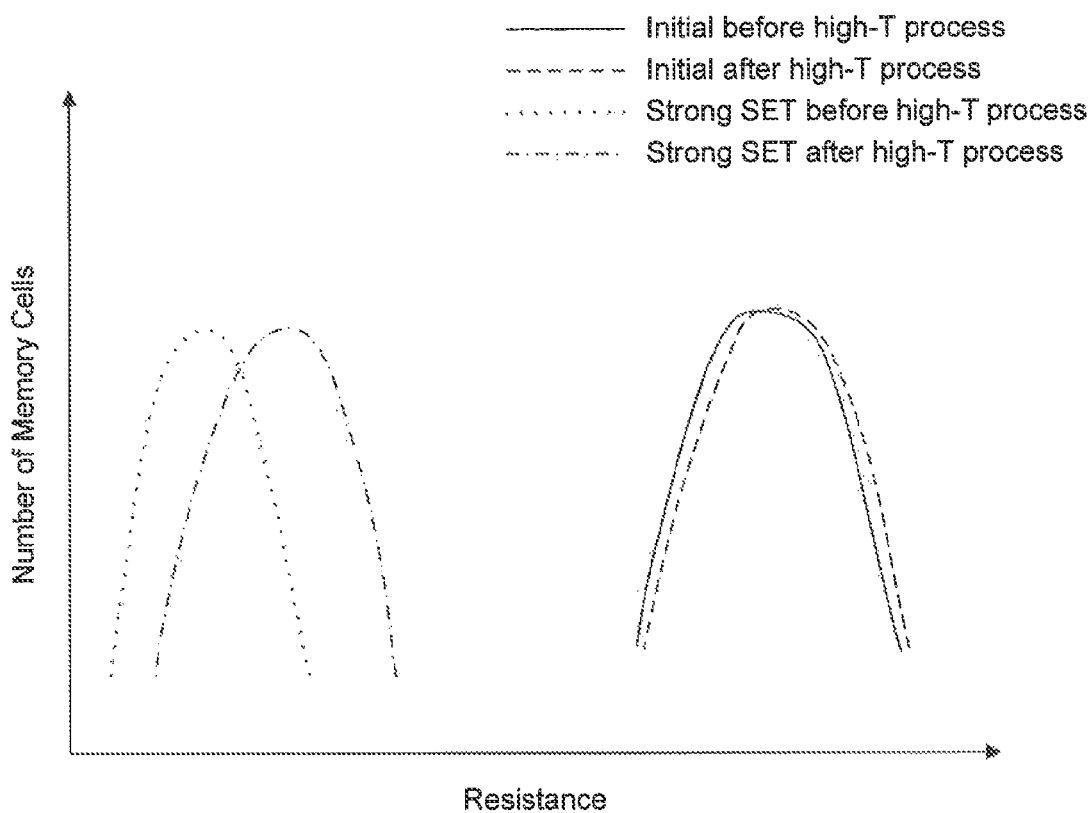

FIG. 3(C) also schematically shows the resistance distributions of Strong SET condition memory cells on a chip before and after the high-temperature process, respectively (the dotted curve and the dash-dotted curve, respectively). As shown in FIG. 3(C), the resistance distribution for the Strong SET condition memory cells does not change much after the high-temperature process. The resistance distributions for the Strong SET condition memory cells and the initial condition memory cells are well separated from each other for both before and after the high-temperature process.

Therefore, a low-resistance state of a memory cell corresponding to the Strong SET condition and a high-resistance state of a memory cell corresponding to the initial condition may also be used to represent bits "1" and "0", respectively. The Strong SET condition could also be considered as a "one-time" condition, similar to the initial condition. However, since the Strong SET condition and the initial condition are more robust during a high-temperature process as compared to the RESET condition, i.e., the Strong SET condition memory cells and the initial condition memory cells have lower state change rates with respect to the high-temperature process as compared to the RESET condition memory cells, a memory cell programmed to the Strong SET condition or the initial condition (a memory cell does not need any operation to remain in the initial condition, but to facilitate description, it is still referred to herein as programming the memory cell to the initial condition) may be used to preserve pre-stored data, and to correct another memory cell programmed to the RESET condition after a high-temperature process.

Since the resistance distribution of phase-change memory cells in the Strong SET condition does not overlap with the resistance distribution of phase-change memory cells in the initial condition after a high-temperature process, a phase-change memory cell programmed to the Strong SET condition or the initial condition can be used in, e.g., a device consistent with embodiments of the disclosure to prevent pre-stored data from being lost, which includes a plurality of memory units. Each memory unit includes a normal memory cell (hereinafter referred to as a Flash cell), which may be affected by an external process, such as a high-temperature process. The memory unit also includes a reference memory cell (hereinafter referred to as a Reference cell), which is not readily affected by the external process. As an example of the embodiments of the disclosure, a phase-change memory cell programmed to the Strong SET condition or the initial condition (example of a Reference cell) is paired with another phase-change memory cell programmed to the SET condition or the RESET condition (example of a Flash cell) to form a memory unit. Then, if the data stored in the another memory cell is lost after an external process, such as a high-temperature process, the data stored in the memory cell programmed to the Strong SET condition or the initial condition can be used to restore the another memory cell.

Figure 4:
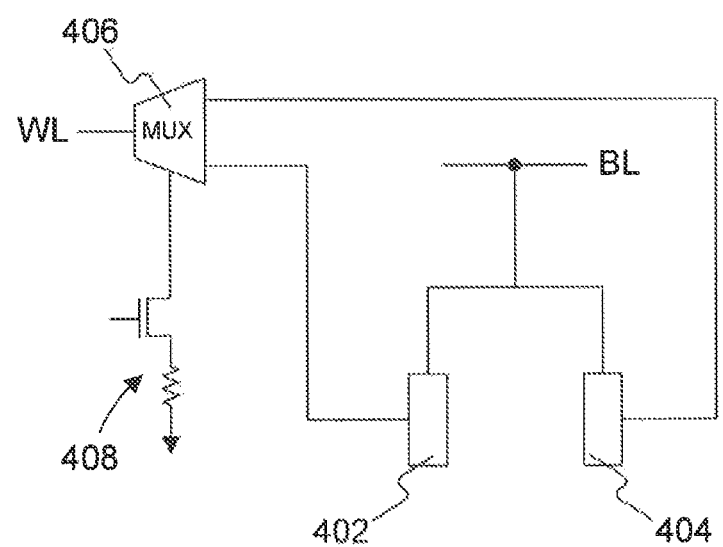
FIG. 4 schematically shows a memory unit according to exemplary embodiments.

FIG. 4 schematically shows an exemplary memory unit 400 consistent with embodiments of the disclosure. The memory unit 400 includes a Reference cell 402 and a Flash cell 404. In some embodiments, the Reference cell 402 and the Flash cell 404 are electrically coupled to a same bit line (BL), as shown in FIG. 4. In some embodiments, the Reference cell 402 and the Flash cell 404 are also electrically coupled to a same word line (WL) such as through a multiplexer (MUX) 406, as shown in FIG. 4. The multiplexer 406 is controlled by a selection transistor 408 to switch between two outputs, so as to select one of the Reference cell 402 or the Flash cell 404 to connect to the word line.

In some embodiments, the Reference cell 402 and the Flash cell 404 are phase-change memory cells having a substantially same structure and being formed of substantially same materials. In these embodiments, for the Reference cell 402, a state having a resistance range corresponding to the Strong SET condition is used to represent bit "1" (such a state is referred to as a Reference low-resistance state), and a state having a resistance range corresponding to the initial condition is used to represent bit "0" (such a state is referred to as a Reference high-resistance state). Moreover, for the Flash cell 404, a state having a resistance range corresponding to the SET condition before being subjected to a high-temperature process is used to represent bit "1" (such a state is referred to as a Flash low-resistance state), and a state having a resistance range corresponding to the RESET state before being subjected to a high-temperature process is used to represent bit "0" (such a state is referred to as a Flash high-resistance state).

Generally, the resistance ranges for Reference cells 402 in the Reference low-resistance state and in the Reference high-resistance state are lower than the resistance range for Flash cells 404 in the Flash low-resistance state and in the Flash high-resistance state, respectively. As used herein, a first resistance range being lower than a second resistance range means an average or median of the first resistance range is lower than the average or median of the second resistance range. The resistance range for Reference cells 402 in one of the Reference states may still overlap the resistance range for Flash cells 404 in one of the Flash states. For example, the resistance of one of the Reference cells 402 in the Reference high-resistance state may fall in the resistance range for Flash cells 404 in either of the Flash high-resistance state or the Flash low-resistance state. However, such an overlapping would not cause confusion because the ranges are for different types of memory cells.

Figure 5:
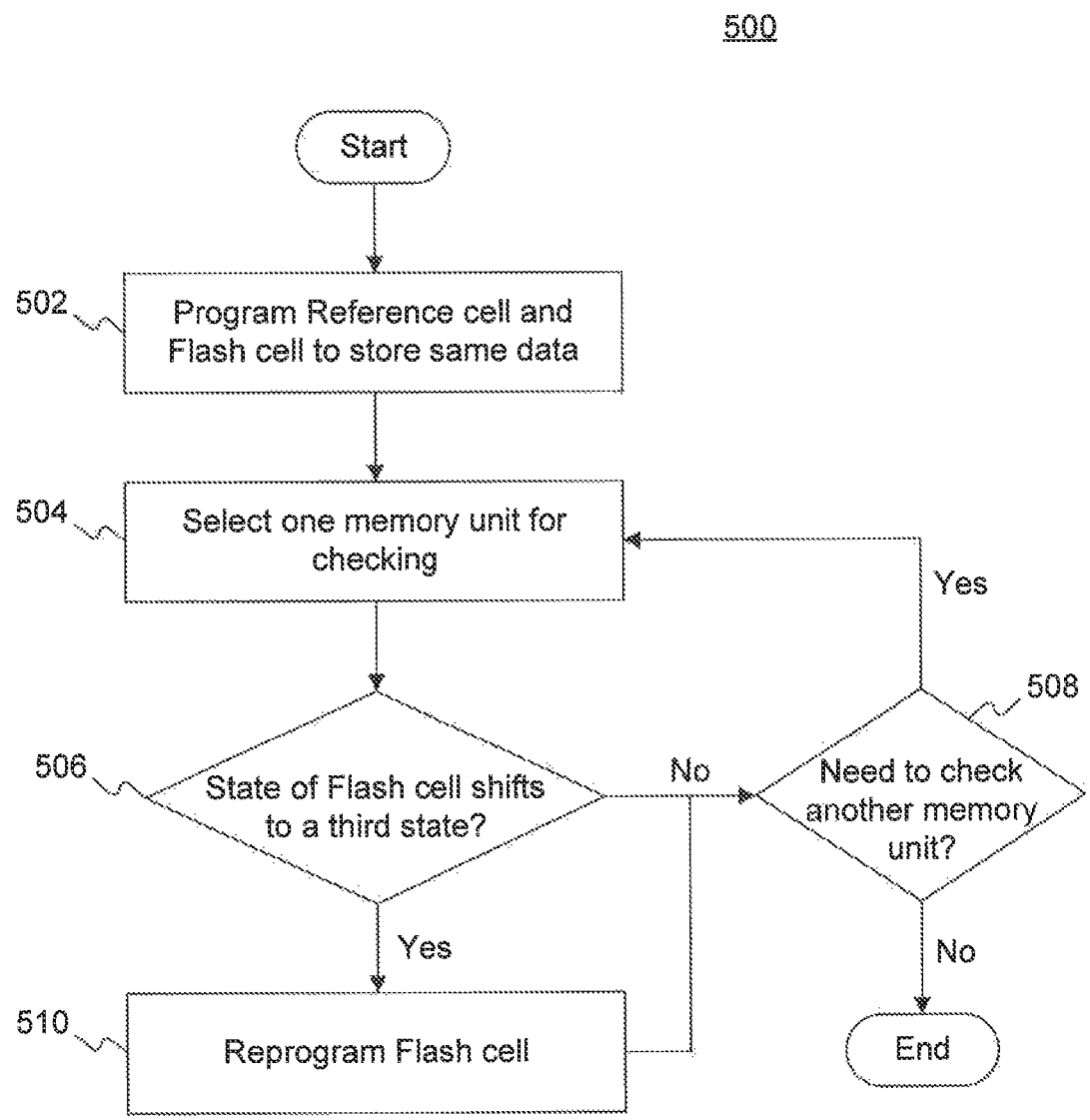
FIG. 5 is a flow chart showing a process for managing memory according to exemplary embodiments.

FIG. 5 is a flow chart 500 schematically showing an exemplary process consistent with embodiments of the disclosure for managing a memory, which may include a plurality of memory units 400 shown in FIG. 4.

Referring to FIG. 5, at 502, memory cells in the memory are programmed so that the Reference cell 402 and the Flash cell 404 in the same memory unit 400 store same data. In some embodiments, the data stored in the Reference cell 402 and the Flash cell 404 is one of bits "1" or "0". For example, the Reference cell 402 is programmed to a first state representing one of "1" or "0", and the Flash cell 404 is programmed to a second state representing the same one of "1" or "0". The first state is a state that is not readily affected by, for example, a high-temperature process, such as a solder bonding process. The second state is a state that may be affected by the high-temperature process.

After the high-temperature process, at 504, one memory unit 400 is selected for checking. At 506, the selected memory cell 400 is checked as to whether the state of the Flash cell 404 in that memory unit 400 shifts to a third state different from the second state, by applying a READ current to at least one of the Reference cell 402 and the Flash cell 404 and checking the reading result. In some embodiments, a first READ current and a second READ current are applied to the Reference cell 402 and the Flash cell 404 to obtain a first reading result and a second reading result, respectively. The first READ current may be the same as the second READ current. The first reading result and the second reading result are compared to determine whether the state of the Flash cell 404 has shifted.

If at 506 it is determined that the state of the Flash cell 404 has not shifted to a third state, the process proceeds to 508, at which it is determined whether there is another memory unit 400 that needs to be checked. If not, the process ends. If the determination result at 508 is yes, the process returns to 504 to select another memory unit 400 for checking.

If the determination result at 506 is yes, the process proceeds to 510, at which the Flash cell 404 is re-programmed according to the data stored in the Reference cell 402, i.e., the data stored in the Reference cell 402 is "copied" to the Flash cell 404. After that, the process proceeds to 508 to determine whether another memory unit 400 needs to be checked.

In some embodiments, the process shown in FIG. 5 may further include, after one of the memory units 400 is checked, enabling the multiplexer 406 to permanently connect the Flash cell 404 to the word line for future use.

In some embodiments, when the Reference cell 402 and the Flash cell 404 are phase-change memory cells having a substantially same structure and being formed of substantially same materials, the first state may be a Reference high-resistance state and the second state may be a Flash high-resistance state. After the high-temperature process, the Reference cell 402 may still be in the Reference high-resistance state, but the Flash cell 404 may shift to a state other than the Flash high-resistance state (and thus lose the pre-stored data). However, if the first state is a Reference low-resistance state and the second state is a Flash low-resistance state, it is likely that the states of both the Reference cell 402 and the Flash cell 404 would not change after the high-temperature process.

Figure 6:
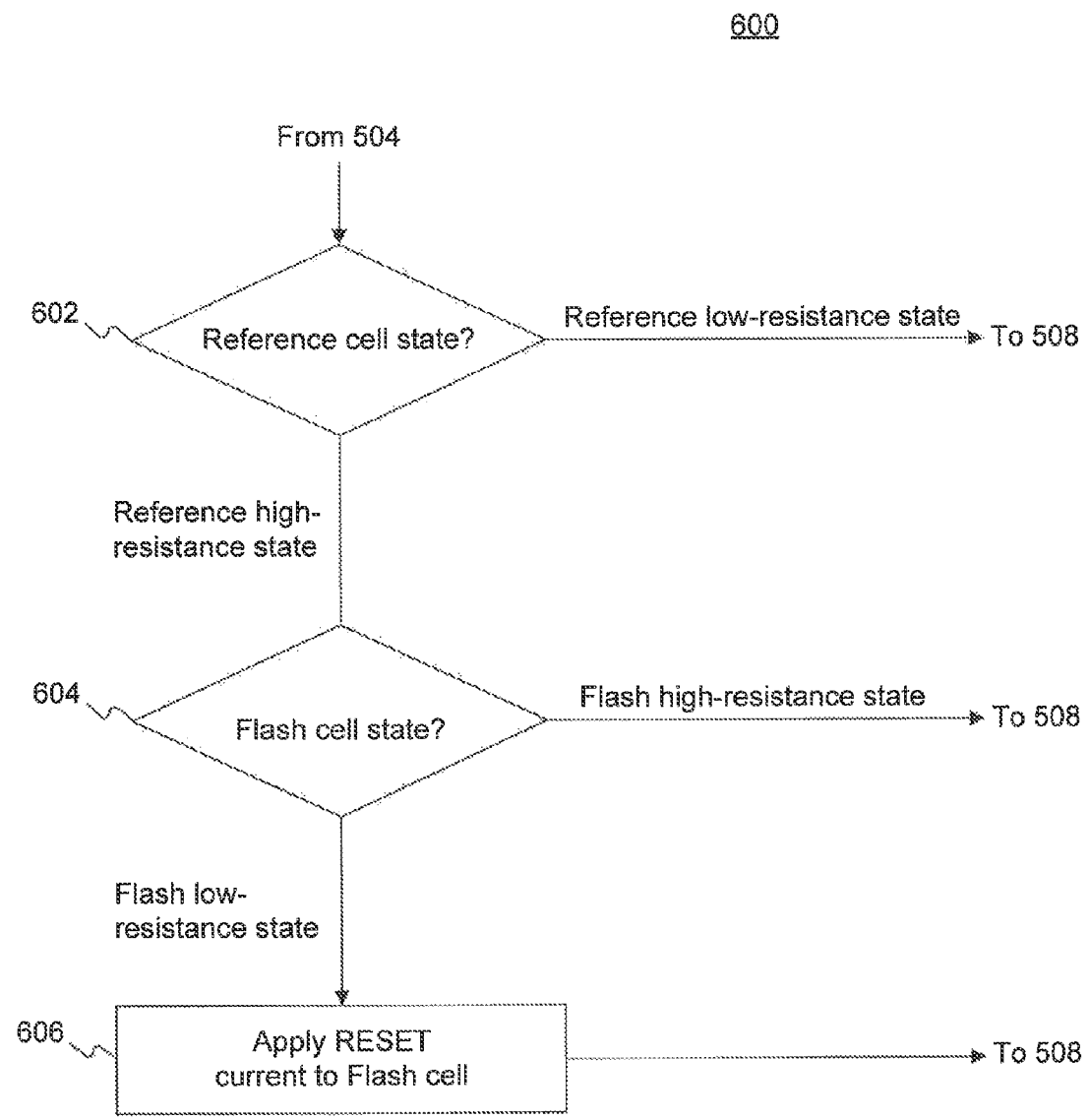
FIG. 6 is a flow chart showing a process for checking and restoring memory cells according to exemplary embodiments.

FIG. 6 is a flow chart 600 showing a detailed process for determining whether the state of the Flash cell 404 has changed. The process shown in FIG. 6 corresponds to 506 and 510 shown in FIG. 5.

At 602, it is checked whether the Reference cell 402 is in the Reference high-resistance state or the Reference low-resistance state. If the Reference cell 402 is in the Reference low-resistance state, then it means that the Flash cell 404 would have been in the Flash low-resistance state. In this case, the state of the Flash cell 404 is likely not affected by the high-temperature process, and no correction is needed. The process thus proceeds directly to 508 shown in FIG. 5.

On the other hand, if, at 602, it is determined that the Reference cell 402 is in the Reference high-resistance state, the process proceeds to 604, at which it is checked whether the Flash cell 404 is in the Flash high-resistance state or the Flash low-resistance state. If the Flash cell 404 is in the Flash high-resistance state, then it means that the state of the Flash cell 404 has not changed. The process proceeds to 508 shown in FIG. 5.

If the checking result of 604 is that the Flash cell 404 is in the Flash low-resistance state, then it means that the state of the Flash cell 404 has changed, because it is inconsistent with the state of the Reference cell 402 (which is in the high-resistance state, representing different data). The process proceeds to 606, at which a RESET current is applied to the Flash cell 404 to re-program it to the Flash high-resistance state. After that, the process proceeds to 508 shown in FIG. 5.

In some embodiments, the Reference cell 402 and the Flash cell 404 may have different structures or be formed with different materials. For example, the Reference cell 402 may include a first memory material for storing data and the Flash cell 404 may include a second memory material for storing data. The first memory material is more difficult to change during the high-temperature process as compared to the second memory material. Programming the Reference cell 402 to the first state may include setting the state of the first memory material to a first material state. Programming the Flash cell 404 to the second state may include setting the state of the second memory material to a second material state. During the high-temperature process, the first material state may not change, while the second material state may possibly be changed.

In the embodiments described above, the effect of a high-temperature process on pre-stored data is discussed. There are other external processes during manufacturing or using a memory that may affect pre-stored data, resulting in data loss. Apparatuses and methods similar to those discussed above can also be used to restore the lost data. More generally, to prevent pre-stored data from being lost during an external process, a memory may include a plurality of memory units, each of which includes two memory cells. One of the two memory cells is in a more robust state, i.e., less likely to lose data during the external process, and the other one of the two memory cells may lose data during the external process. A first memory cell being in a more robust state than a second memory cell means either the two memory cells are made of same or similar materials but the first memory cell is programmed to a more robust state, or the first memory cell is made of a material whose state is less likely to change than the material of the second memory cell during the external process.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for managing memory, comprising:
setting a state of a first memory cell to a first state representing a first data;
setting a state of a second memory cell to a second state representing the first data;
determining whether the state of the second memory cell has changed to a third state representing a second data different from the first data, by reference to the state of the first memory cell; and
changing, if the state of the second memory cell has changed to the third state, the state of the second memory cell back to the second state.

2. The method according to claim 1, wherein determining whether the state of the second memory cell has changed to the third state further includes:
applying a first read current to the first memory cell to obtain a first reading result representing data stored in the first memory cell,
applying a second read current to the second memory cell to obtain a second reading result representing data stored in the second memory cell, and
comparing the second reading result with the first reading result to determine whether the state of the second memory cell has changed to the third state.

3. The method of claim 1, wherein:
the first and second memory cells have a substantially same structure,
setting the state of the first memory cell to the first state includes setting a resistance of the first memory cell to be within a first resistance range,
setting the state of the second memory cell to the second state includes setting a resistance of the second memory cell to be within a second resistance range.

4. The method of claim 3, wherein setting the resistance of the second memory cell to be within the second resistance range includes setting the resistance of the second memory cell to be within the second resistance range higher than the first resistance range.

5. The method of claim 3, wherein:
determining whether the state of the second memory cell has changed to the third state further includes determining whether the resistance of the second memory cell is changed to be within a third resistance range representing the second data, and
changing the state of the second memory cell back to the second state includes changing the resistance of the second memory cell back to be within the second resistance range.

6. The method of claim 3, wherein:
setting the resistance of the first memory cell to be within the first resistance range includes keeping the resistance of the first memory cell within an initial resistance range, and
setting the resistance of the second memory cell to be within the second resistance range includes applying a current to the second memory cell for a period of time.

7. The method of claim 6, wherein changing the state of the second memory cell back to the second state includes applying the current to the second memory cell for the period of time.

8. The method of claim 3, wherein:
setting the resistance of the first memory cell to be within the first resistance range includes applying a first current to the first memory cell for a first period of time,
setting the resistance of the second memory cell to be within the second resistance range includes applying a second current to the second memory cell for a second period of time,
a value of the first current is about the same as a value of the second current, and
the first period of time is longer than the second period of time.

9. The method of claim 1, wherein:
the first memory cell comprises a first memory material for storing data,
the second memory cell comprises a second memory material for storing data, the second memory material being different from the first memory material,
a state of the first memory material is more difficult to change as compared to a state of the second memory material,
setting the state of the first memory cell to the first state includes setting the state of the first memory material to a first material state, and
setting the state of the second memory cell to the second state includes setting the state of the second memory material to a second material state.

10. A memory comprising:
a first memory cell for storing a first state representing a first data;
a second memory cell for storing a second state representing the first data; and
a selection circuit configured to select one of the first or the second memory cell to couple to a word line,
wherein:
the first and second memory cells are coupled to a same bit line, and
the selection circuit includes a multiplexer.

11. The memory of claim 10, wherein the first and second memory cells have different state change rates with respect to a heating process.

12. The memory of claim 10, wherein:
the first and second memory cells have a substantially same structure,
a resistance of the first memory cell is within a first resistance range, and
a resistance of the second memory cell is within a second resistance range.

13. The memory of claim 12, wherein the first resistance range is lower than the second resistance range.

14. The memory of claim 10, wherein:
the first memory cell comprises a first memory material for storing data,
the second memory cell comprises a second memory material for storing data, the second memory material being different from the first memory material.

15. The memory of claim 10, wherein the first and second memory cells are phase-change memory cells.

16. The memory of claim 15, wherein each of the first and second memory cells comprises:
an access device, and a phase-change element electrically coupled between the access device and the bit line, the phase-change element comprising a phase-change material.

17. The memory of claim 16, wherein:

the access device is a field-effect transistor (FET), and the phase-change element is electrically coupled between one of a drain or a source of the FET and the bit line.

18. The memory of claim 16, wherein:

the access device is a bipolar-junction transistor (BJT), and the phase-change element is electrically coupled between one of a collector or an emitter of the BJT and the bit line.

19. The memory of claim 16, wherein:

the access device is a diode, and the phase-change element is electrically coupled between one of an anode or a cathode of the diode and the bit line.

\* \* \* \* \*